United States Patent
Chen

(10) Patent No.: US 7,625,778 B2
(45) Date of Patent: Dec. 1, 2009

(54) METHOD OF MANUFACTURING A SUBSTRATE-FREE FLIP CHIP LIGHT EMITTING DIODE

(75) Inventor: Ching-Chung Chen, Kaohsiung (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 408 days.

(21) Appl. No.: 11/148,606

(22) Filed: Jun. 8, 2005

(65) Prior Publication Data

US 2006/0278884 A1  Dec. 14, 2006

(51) Int. Cl.
H01L 21/44 (2006.01)
H01L 29/06 (2006.01)

(52) U.S. Cl. ............... 438/108; 438/22; 438/26; 438/39; 438/41; 438/455; 257/E33.005; 257/E33.006; 257/E33.057; 257/E33.063; 257/E33.064

(58) Field of Classification Search ............ 438/22, 438/108, 26, 39, 41, 455
See application file for complete search history.

(56) References Cited

U.S. PATENT DOCUMENTS

| | | | |
|---|---|---|---|
| 6,462,358 B1 | 10/2002 | Lin et al. | 257/99 |
| 6,784,463 B2 * | 8/2004 | Camras et al. | 257/99 |
| 2003/0133645 A1 * | 7/2003 | Mearini et al. | 385/18 |
| 2004/0188791 A1 | 9/2004 | Horng et al. | 257/434 |
| 2004/0211972 A1 | 10/2004 | Du et al. | 257/99 |
| 2004/0227148 A1 | 11/2004 | Camras et al. | 257/99 |
| 2005/0062061 A1 | 3/2005 | Horng et al. | 257/103 |
| 2005/0191777 A1 | 9/2005 | Horng et al. | 438/22 |

FOREIGN PATENT DOCUMENTS

| | | |
|---|---|---|
| DE | 199 21 987 | 11/1999 |
| DE | 10 2004 036 295 | 3/2005 |
| EP | 0896405 A3 | 10/2000 |
| WO | WO 03088320 | 10/2003 |

OTHER PUBLICATIONS

Chen-Fu Chu et al., "Comparison of p-Side Down and p-Side Up GaN light-Emitting Diodes Fabricated by Laser Lift-Off" The Japan Society of Applied Physics, vol. 42 (2003), pp. L147-L150 Part 2, No. 2B, Feb. 15, 2003.

* cited by examiner

Primary Examiner—Samuel A Gebremariam
(74) Attorney, Agent, or Firm—J.C. Patents

(57) ABSTRACT

A substrate-free LED device is provided. The LED device comprises a substrate, an epitaxial layer disposed on the substrate, a first electrode disposed on a portion of the epitaxial layer, a second electrode disposed on another portion of the epitaxial layer, and a protection layer, disposed over the epitaxial layer. It is noted that in the LED device, the substrate comprises, for example but not limited to, high heat-sink substrate, and the protection layer comprises, for example but not limited to, high heat-sink, high transparent material.

18 Claims, 5 Drawing Sheets

METHOD OF MANUFACTURING A SUBSTRATE-FREE FLIP CHIP LIGHT EMITTING DIODE

BACKGROUND OF THE INVENTION

1. Field of the Invention

The present invention generally relates to a light emitting diode and manufacturing method thereof. More particularly, the present invention relates to a substrate-free flip chip light emitting diode and manufacturing method thereof.

2. Description of Related Art

Light emitting diode (LED) is a semiconductor component that has been broadly used as light emission device. The light emitting chip of the LED is generally comprised of III-V compound semiconductor such as gallium phosphide (GaP), gallium arsenide (GaAs), or gallium nitride (GaN). The principle of light emission of LED is the transformation of electrical energy into light energy, which is performed by applying current to the compound semiconductor to generate electrons and holes. Thereafter, an excess energy is released by the combination of electrons and holes, and thus the LED emits light. In general, the LED has the advantages of fast response speed (generally about $10^{-9}$ seconds), excellent monochromatic color light, small size, low power consumption, low contamination (mercury free), high reliability, and the manufacturing process is suitable for mass production. Therefore, the application of LED is very broad and includes, for example, traffic light, large size displaying billboard and the display of many portable electronic devices.

In principle, a fundamental structure of a LED device includes an epitaxy layer of a P-type and a N-type III-V group compound and a light emitting layer in-between. The light emitting efficiency of the LED device is dependent on the internal quantum efficiency of the light emitting layer and the light extraction efficiency of the device. A method of increasing the internal quantum efficiency includes, for the most part, improving the quality of the light emitting layer and the design of the structure. The method of increasing the light extraction efficiency includes, for the most part, decreasing the light loss caused by the absorption of the light emitted from the light emitting layer due to the reflection of the light inside the LED device.

Conventionally, a variety of LED structures and manufacturing methods has been developed. Hereinafter, an exemplary embodiment showing the LED structure and the manufacturing method thereof according to the U.S. Pat. No. 6,462,358 will be described. FIG. 1A to FIG. 1B are cross-sectional views schematically illustrating a manufacturing process of a conventional LED device. Referring to FIG. 1A, The epitaxial structure 100 includes an N-type GaAs substrate 102, an etching stop layer 104, an N-type $(Al_xGa_{1-x})_{0.5}In_{0.5}P$ lower cladding layer 106 ($0.5 \leq x \leq 1.0$), a $(Al_xGa_{1-x})_{0.5}In_{0.5}P$ active layer 108 ($0 \leq x \leq 0.45$), a P-type $(Al_xGa_{1-x})_{0.5}In_{0.5}P$ upper cladding layer 110 ($0.5 \leq \leq 1.0$), a P-type epitaxial layer 112 and a plurality P-type ohmic contacts 114a and 114b.

Next, referring to FIG. 1B, a transparent adhesive layer 122 and a transparent substrate 124 are formed over the P-type epitaxial layer 112 and covers the p-type ohmic contacts 114a and 114b. The transparent substrate 124 is connected to the P-type ohmic contacts 114a and 114b and the epitaxial layer 112 by pressuring and heating the transparent adhesive layer 122 at 250° C. for a while. The transparent adhesive layer 122 is composed of B-staged bisbenzocyclobutene (BCB) or other transparent adhesive materials such as epoxy. The transparent substrate 124 includes polycrystal substrate or amorphous substrate, such as sapphire, glass, GaP, GaAsP, ZnSe, ZnS, ZnSSe, or SiC substrate.

Then, the substrate 102 is etched by a corrosive etchant. If the etching stop layer 104 is made of light-absorption materials, such as GaInP or AlGaAs, the etching stop layer 104 must be removed by the same solution. Then, referring to FIG. 1B, a portion of the lower cladding layer 106, the active layer 108 and the upper cladding layer 110 is removed by dry etching or wet etching process to expose a portion of the epitaxial layer 112. Subsequently, the lower portion of the exposed epitaxial layer 112 is removed to form a channel 132 exposing the P-type ohmic contact 114b. Then, an N-type ohmic contact 134 is formed on the lower cladding layer 106. Thereafter, a first metal bonding layer 136 is formed on the epitaxial layer 112 and the channel 132 is filled by Au or Al to form an electrode channel 132 connecting the P-type ohmic contact 114b. Then, a second metal bonding layer 138 is formed on the N-type ohmic contact layer 134. Finally, a LED epitaxial structure 150 is formed.

Accordingly, in the manufacturing process of conventional LED device, since the adhesive layer 122 and the substrate 124 have to be transparent, the heat-sink efficiency of the material of the adhesive layer 122 and the substrate 124 described above is poor. Thus, the life period of the conventional LED device is reduced. In addition, the substrate having a better light transmittance such as sapphire is very expensive, if a substance having poor light transmittance is provided, the cost may be reduced but the light emitting efficiency of the conventional LED device is also reduced. Moreover, to enhance the light transmittance of the conventional LED device, the surface of the transparent substrate 124 has to be polished, thus the process is more complex and the yield of the process is reduced.

SUMMARY OF THE INVENTION

Accordingly, the present invention is directed to a substrate-free LED device and manufacturing method thereof, wherein the LED device does not need a conventional transparent substrate. Therefore, the cost of the LED device is reduced, the heat-sink efficiency is enhanced and the manufacturing process of the LED device is simplified.

The invention provides a manufacturing method for a LED. The manufacturing method comprises, for example but not limited to, the following steps. First of all, a first substrate is provided, and an epitaxial layer is formed on the first substrate. Then, a junction substrate is formed over the epitaxial layer by adhering an adhering layer between the epitaxial layer and the junction substrate. Then, the first substrate is removed. Next, a first electrode is formed on the epitaxial layer. Then, a portion of the epitaxial layer is removed to form a removed epitaxial layer. Next, a second electrode is formed on the removed epitaxial layer. Then, a second substrate is formed over the first electrode and the second substrate. Next, the junction substrate and the adhering layer are removed, and a protection layer is formed over the epitaxial layer.

In one embodiment of the invention, the first substrate comprises, for example but not limited to, gallium arsenide (GaAs), aluminum oxide ($Al_2O_3$) or silicon carbide (SiC) substrate.

In one embodiment of the invention, the material of the epitaxial layer comprises, for example but not limited to, two-element compound semiconductor such as GaN, GaAs, or InN, three-element compound semiconductor such as GaAlAs or four-element compound semiconductor such as AlInGaP.

In one embodiment of the invention, the junction substrate comprises, for example but not limited to, glass, silicon substrate or aluminum oxide ($Al_2O_3$) substrate.

In one embodiment of the invention, the first substrate is removed by dry etching process.

In one embodiment of the invention, a remained thickness of the removed epitaxial layer is less than a thickness of a current distribution layer of the epitaxial layer, and the second electrode is connected to the current distribution layer of the epitaxial layer.

In one embodiment of the invention, the current distribution layer is P-type, the first electrode comprises N-type ohmic contact electrode, and the second electrode comprises P-type ohmic contact electrode.

In one embodiment of the invention, the current distribution layer is N-type, the first electrode comprises P-type ohmic contact electrode, and the second electrode comprises N-type ohmic contact electrode.

In one embodiment of the invention, the total thickness of the first electrodes and the epitaxial layer is equal to the total thickness of the second electrode and the removed epitaxial layer.

In one embodiment of the invention, the second substrate comprises high heat-sink substrate such as silicon or ceramic.

In one embodiment of the invention, the protection layer comprises high heat-sink, high transparent substrate such as diamond-like carbon (DLC), silicon oxide ($SiO_2$) or silicon nitride ($SiN_x$).

In addition, the present invention provides a manufacturing method for a light emitting diode (LED). The manufacturing method comprises, for example but not limited to, the following steps. First of all, a first substrate is provided. Then, an epitaxial layer is formed on the first substrate. Next, a first electrode is formed on the epitaxial layer. Then, a portion of the epitaxial layer is removed to form a removed epitaxial layer. Next, a second electrode is formed on the removed epitaxial layer. Then, a second substrate is formed over the first electrode and the second substrate. Next, the first substrate is removed and a protection layer is formed over the epitaxial layer.

In one embodiment of the invention, the first substrate comprises, for example but not limited to, gallium arsenide (GaAs), aluminum oxide ($Al_2O_3$) or silicon carbide (SiC) substrate.

In one embodiment of the invention, the material of the epitaxial layer comprises, for example but not limited to, two-element compound semiconductor such as GaN, GaAs, or InN, three-element compound semiconductor such as GaAlAs or four-element compound semiconductor such as AlInGaP.

In one embodiment of the invention, the first substrate is removed by dry etching process.

In one embodiment of the invention, a remained thickness of the removed epitaxial layer is less than a thickness of a current distribution layer of the epitaxial layer, and the second electrode is connected to the current distribution layer of the epitaxial layer.

In one embodiment of the invention, the current distribution layer is P-type, the first electrode comprises N-type ohmic contact electrode, and the second electrode comprises P-type ohmic contact electrode.

In one embodiment of the invention, the current distribution layer is N-type, the first electrode comprises P-type ohmic contact electrode, and the second electrode comprises N-type ohmic contact electrode.

In one embodiment of the invention, the total thickness of the first electrodes and the epitaxial layer is equal to the total thickness of the second electrode and the removed epitaxial layer.

In one embodiment of the invention, the second substrate comprises high heat-sink substrate such as silicon or ceramic.

In one embodiment of the invention, the protection layer comprises high heat-sink, high transparent substrate such as diamond-like carbon (DLC), silicon oxide ($SiO_2$) or silicon nitride ($SiN_x$).

Furthermore, the invention provides a LED, comprising, for example but not limited to, a substrate, an epitaxial layer disposed on the substrate, a first electrode disposed on a portion of the epitaxial layer, a second electrode disposed on another portion of the epitaxial layer, and a protection layer, disposed over the epitaxial layer. It is noted that in the LED device, the substrate comprises, for example but not limited to, high heat-sink substrate, and the protection layer comprises, for example but not limited to, high heat-sink, high transparent material.

In one embodiment of the invention, the material of the epitaxial layer comprises, for example but not limited to, two-element compound semiconductor such as GaN, GaAs, or InN, three-element compound semiconductor such as GaAlAs or four-element compound semiconductor such as AlInGaP.

In one embodiment of the invention, a remained thickness of the removed epitaxial layer is less than a thickness of a current distribution layer of the epitaxial layer, and the second electrode is connected to the current distribution layer of the epitaxial layer.

In one embodiment of the invention, the current distribution layer is P-type, the first electrode comprises N-type ohmic contact electrode, and the second electrode comprises P-type ohmic contact electrode.

In one embodiment of the invention, the current distribution layer is N-type, the first electrode comprises P-type ohmic contact electrode, and the second electrode comprises N-type ohmic contact electrode.

In one embodiment of the invention, the total thickness of the first electrodes and the epitaxial layer is equal to the total thickness of the second electrode and the removed epitaxial layer.

In one embodiment of the invention, the high heat-sink substrate of the substrate comprises, for example but not limited to, silicon or ceramic.

In one embodiment of the invention, the high heat-sink, high transparent material of the protection layer comprises, for example but not limited to, diamond-like carbon (DLC), silicon oxide ($SiO_2$) or silicon nitride ($SiN_x$).

Accordingly, in the LED device of the present invention, since the substrate of the conventional LED is replaced by the high heat-sink substrate disposed in the other side of the epitaxial layer, the heat-sink efficiency is enhanced and the structure strength of the LED device is maintained. In addition, since the high heat-sink, high transparent protection layer is provided, the light transmittance of the surface of the LED device is excellent, and thus the light emitting efficiency of the LED device is also excellent. Moreover, the surface of the LED device of the invention does not need to be polished. Accordingly, the present invention provides a high light emitting efficiency, high heat-sink efficiency, low-cost, simple process, and high yield LED device and manufacturing method thereof.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The following drawings illustrate embodiments of the invention and, together with the description, serve to explain the principles of the invention.

DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1A:
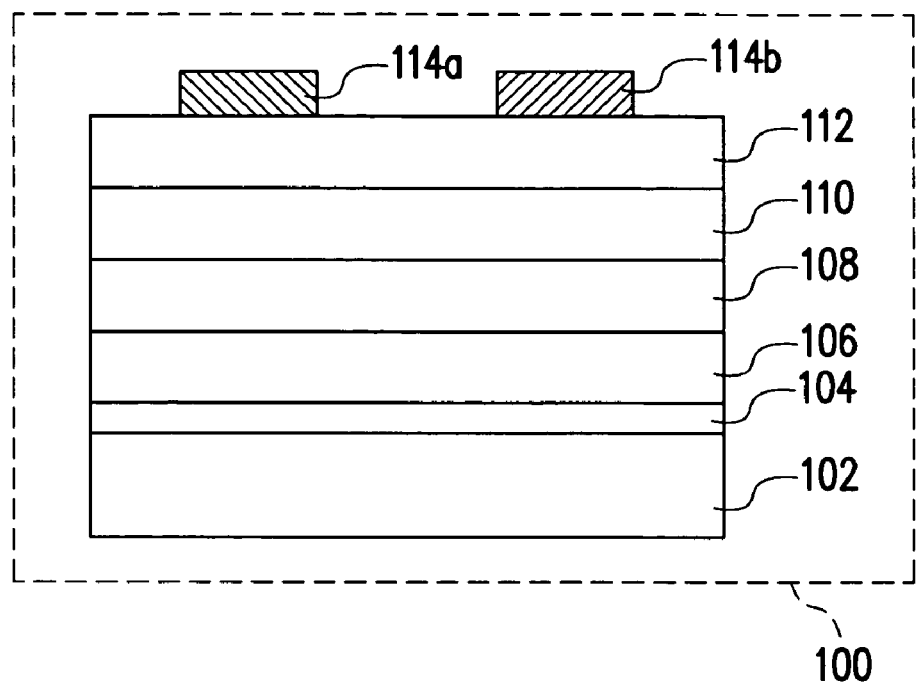
FIG. 1A to FIG. 1B are cross-sectional views schematically illustrating a manufacturing process of a conventional LED device.
Figure 1B:
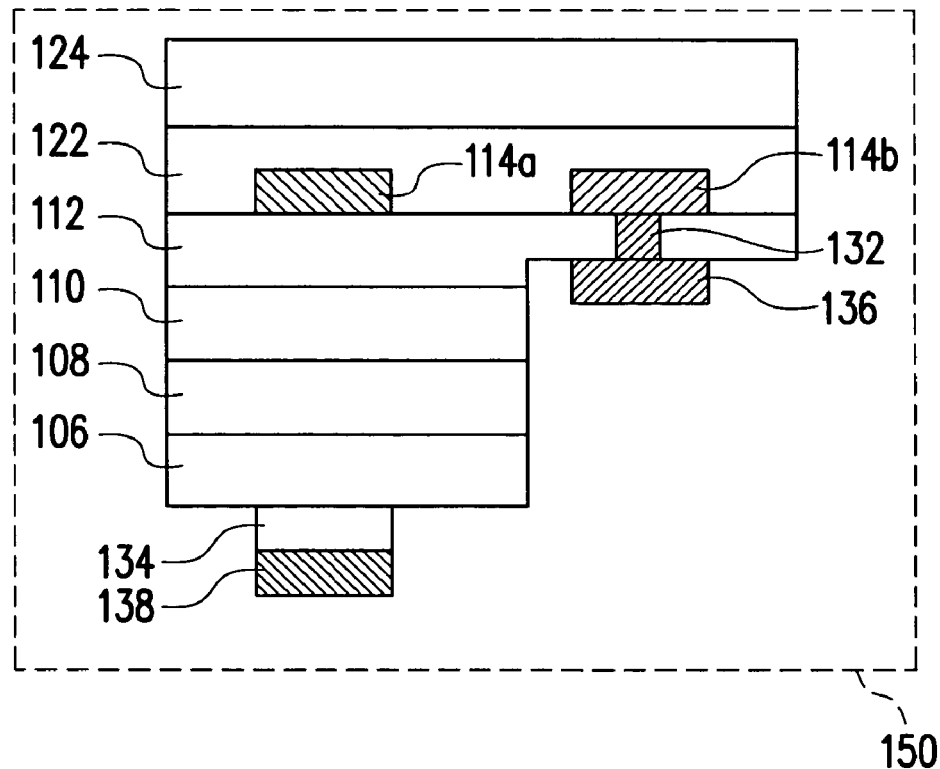
Figure 2A:
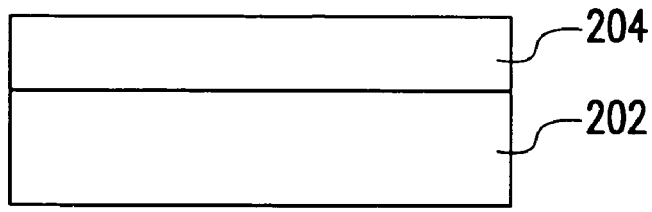
FIG. 2A to FIG. 2G are cross-sectional views schematically illustrating a process flow for manufacturing a LED device according to one embodiment of the present invention.

FIG. 2A to FIG. 2G are cross-sectional views schematically illustrating a process flow for manufacturing a LED device according to one embodiment of the present invention. Referring to FIG. 2A, first of all, a first substrate 202 is provided. In one embodiment of the invention, the first substrate 202 comprises, for example but not limited to, gallium arsenide (GaAs), aluminum oxide ($Al_2O_3$) or silicon carbide (SiC) substrate. In addition, the first substrate 202 is, for example but not limited to, transparent or non-transparent. Thereafter, an epitaxial layer 204 is formed on the first substrate 202. In one embodiment of the invention, the epitaxial layer 204 is comprised of, for example but not limited to, two-element compound semiconductor such as GaN, GaAs, InN, three-element compound semiconductor such as GaAlAs, or four-element compound semiconductor such as AlInGaP.

Figure 2B:
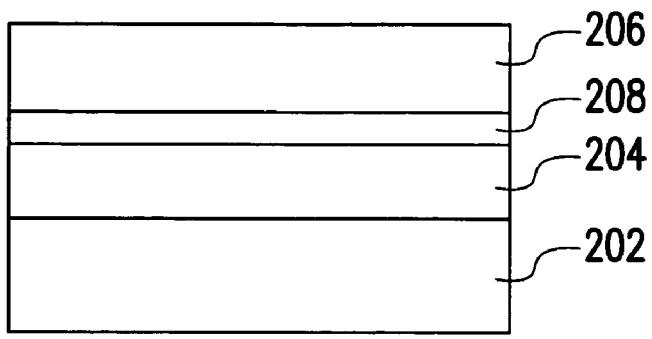

Next, referring to FIG. 2B, a junction substrate 206 is disposed over the epitaxial layer 204 by an adhering layer 208 by using, for example but not limited to, thermal compressing process. In one embodiment of the present invention, the temperature range of the thermal compressing process may be, for example, in a range of about 200° C. to about 250° C. The junction substrate 206 comprises, for example but not limited to, glass, silicon substrate or aluminum oxide ($Al_2O_3$) substrate. It is noted that the junction substrate 206 is only provided for supporting the epitaxial layer 204 and the first substrate 202 to prevent from damage or break. Therefore, the junction substrate 206 and the adhering layer 208 will be removed in the later process steps. Thus, the junction substrate 206 and the adhering layer 208 may be comprised of, for example but not limited to, low-cost transparent or non-transparent material. However, in the conventional LED device, the junction substrate 206 and the adhering layer 208 must be transparent and are expensive.

Figure 2C:
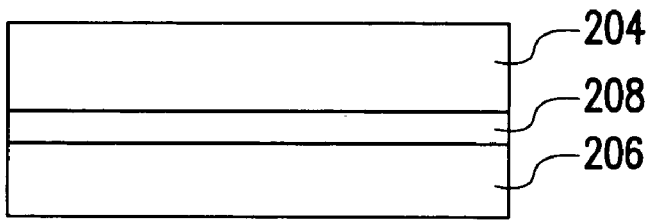
Figure 2D:
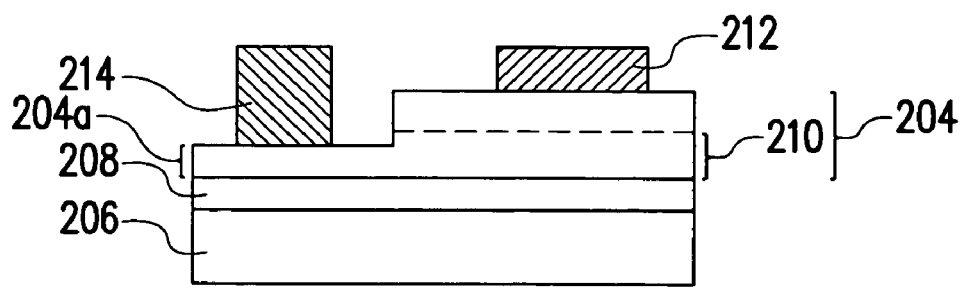

Then, referring to FIG. 2C, the first substrate 202 is removed by, for example but not limited to, dry etching or wet etching process using such as excimer laesr. Next, referring to FIG. 2D, an electrode 212 is formed on the epitaxial layer 204. Then, a portion of the epitaxial layer 204 is removed by, for example but not limited to, etching process, and thus an removed epitaxial layer 204a is formed. It is noted that, as shown in FIG. 2D, the remained thickness of the removed epitaxial layer 204a is less than the thickness of the current distribution layer 210 of the epitaxial layer 204. Therefore, another electrode 214 is formed on the removed epitaxial layer 204a and connected to the current distribution layer 210 of the epitaxial layer 204. In one embodiment of the invention, the current distribution layer 210 is P-type/N-type, the electrode 212 comprises N-type/P-type ohmic contact electrode, and the electrode 214 comprises P-type/N-type ohmic contact electrode. Therefore, two electrodes 212 and 214 are disposed at the same side of the epitaxial layer 204. In another embodiment of the invention, the total thickness of the electrodes 212 and the epitaxial layer 204 is equal or close to the total thickness of the electrode 214 and the removed epitaxial layer 204a.

Figure 2E:
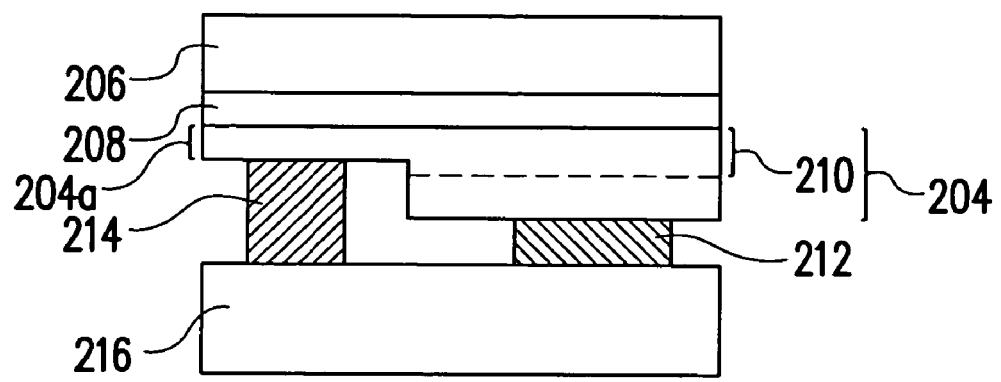
Figure 2F:
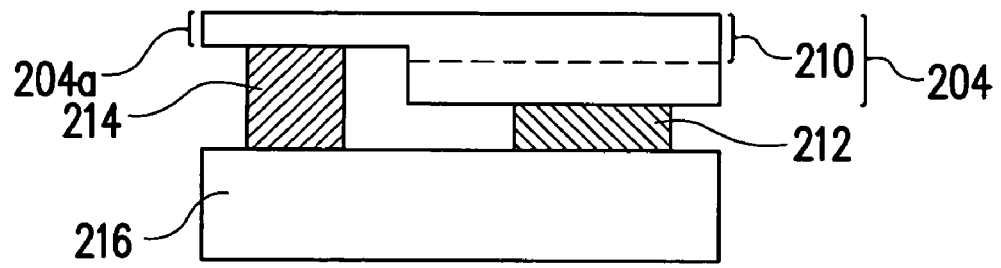

Then, referring to FIG. 2E, the electrodes 212 and 214 is attached to a second substrate 216. The second substrate 216 comprises, for example but not limited to, high heat-sink substrate. The material of the high heat-sink silicon substrate comprises silicon or ceramic. Therefore, referring to FIG. 2F, the junction substrate 206 and the adhering layer 208 are removed by, for example but not limited to, etching process. Then referring to FIG. 2F, a protection layer 218 is formed over the epitaxial layer 204 by using, for example but not limited to, deposition process. The protection layer 218 comprises, for example but not limited to, high heat-sink, high transparent material composed of diamond-like carbon (DLC), silicon oxide ($SiO_2$) or silicon nitride ($SiN_x$). Then, the whole second substrate 216 is cut and divided into a plurality of filp-chip LED chips 220. Accordingly, since the light emitting layer is only covered by the high heat-sink, high transparent protection layer 218, the LED chip 220 has excellent light emitting efficiency and high heat-sink efficiency. In addition, since the substrate of the conventional LED chip is replaced by the high heat-sink second substrate 216, the structure strength of the LED chip 220 is maintained. In one embodiment of the invention, the LED chip 220 and the manufacturing process illustrated by FIG. 2A to FIG. 2G is, for example but not limited to, provided for three-element/four-element compound semiconductor red light/yellow light LED device.

Figure 3A:
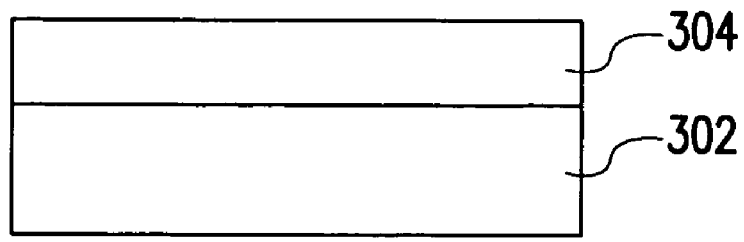
FIG. 3A to FIG. 3E are cross-sectional views schematically illustrating a process flow for manufacturing a LED device according to one embodiment of the present invention.

Hereinafter, another embodiment for manufacturing a LED chip and device of the invention is provided. FIG. 3A to FIG. 3E are cross-sectional views schematically illustrating a process flow for manufacturing a LED device according to one embodiment of the present invention. Referring to FIG. 3A, first of all, a first substrate 302 is provided. In one embodiment of the invention, the first substrate 302 comprises, for example but not limited to, gallium arsenide (GaAs), aluminum oxide ($Al_2O_3$) or silicon carbide (SiC) substrate. In addition, the first substrate 302 is, for example but not limited to, transparent or non-transparent. Thereafter, an epitaxial layer 304 is formed on the first substrate 302. In one embodiment of the invention, the epitaxial layer 304 is comprised of, for example but not limited to, two-element compound semiconductor such as GaN, GaAs, InN, three-element compound semiconductor such as GaAlAs, or four-element compound semiconductor such as AlInGaP.

Figure 3B:
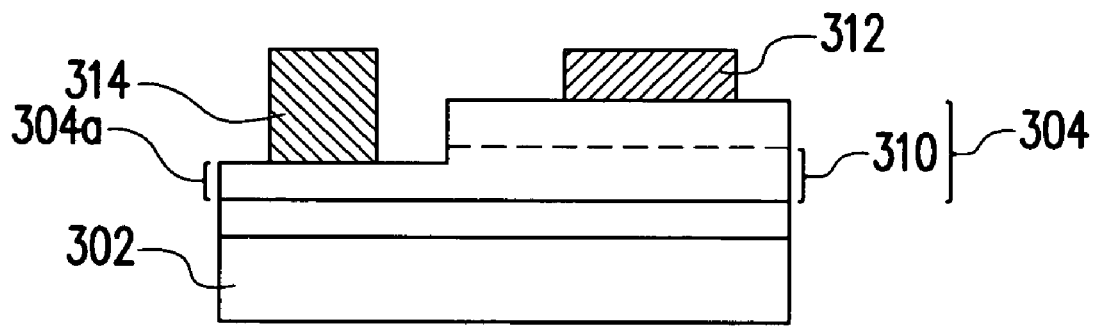

Then, referring to FIG. 3B, an electrode 312 is formed on the epitaxial layer 304. Then, a portion of the epitaxial layer 304 is removed by, for example but not limited to, etching process, and thus an removed epitaxial layer 304a is formed. It is noted that, as shown in FIG. 3B, the remained thickness of the removed epitaxial layer 304a is less than the thickness of the current distribution layer 310 of the epitaxial layer 304. Therefore, another electrode 314 is formed on the removed epitaxial layer 304a and connected to the current distribution layer 310 of the epitaxial layer 304. In one embodiment of the invention, the current distribution layer 310 is P-type/N-type, the electrode 312 comprises N-type/P-type ohmic contact electrode, and the electrode 314 comprises P-type/N-type ohmic contact electrode. Therefore, two electrodes 312 and 314 are disposed at the same side of the epitaxial layer 304. In another embodiment of the invention, the total thickness of the electrodes 312 and the epitaxial layer 304 is equal or close to the total thickness of the electrode 314 and the removed epitaxial layer 304a.

Figure 3C:
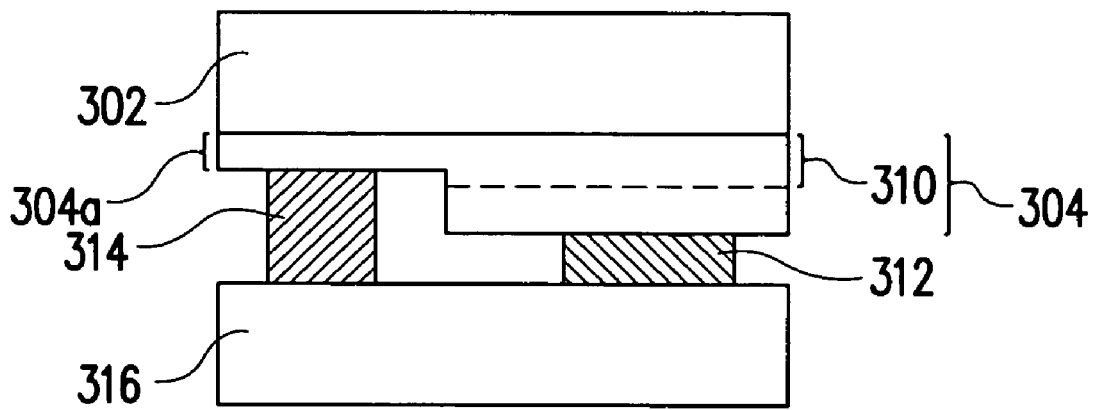
Figure 3D:
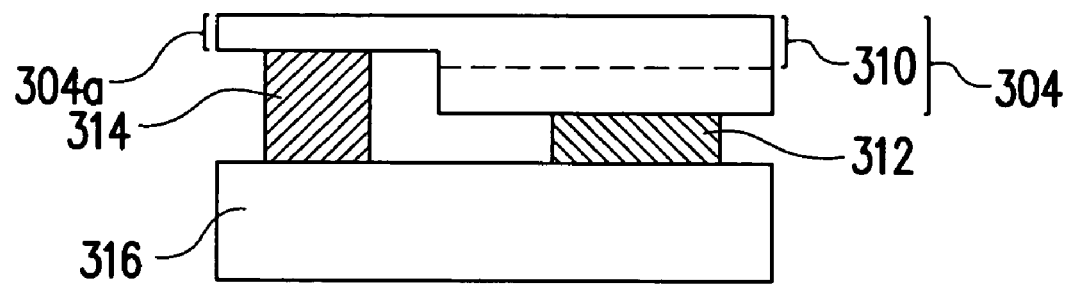

Then, referring to FIG. 3C, the electrodes 312 and 314 are attached to a second substrate 316. The second substrate 316 comprises, for example but not limited to, high heat-sink substrate. The material of the high heat-sink silicon substrate comprises silicon or ceramic. Therefore, referring to FIG. 3D, the first substrate 302 is removed by, for example but not limited to, dry etching process such as using excimer laser. Then referring to FIG. 3E, a protection layer 318 is formed over the epitaxial layer 304 by using, for example but not limited to, deposition process. The protection layer 318 comprises, for example but not limited to, high heat-sink, high transparent material composed of diamond-like carbon (DLC), silicon oxide ($SiO_2$) or silicon nitride ($SiN_x$). Then, the whole second substrate 316 is cut and divided into a plurality of filp-chip LED chips 320. Accordingly, since the light emitting layer is only covered by the high heat-sink, high transparent protection layer 318, the LED chip 320 has excellent light emitting efficiency and high heat-sink efficiency. In addition, since the substrate of the conventional LED chip is replaced by the high heat-sink second substrate 316, the structure strength of the LED chip 320 is maintained. In one embodiment of the invention, the LED chip 320 and the manufacturing process illustrated by FIG. 3A to FIG. 3E is, for example but not limited to, provided for two-element compound semiconductor such as GaN LED device or nitride-containing semiconductor LED device for emitting blue light or green light.

In one embodiment of the present invention, the thickness of the epitaxial layer 304 may be in a range of about 100 nm to about 150 nm, and may be dependent on the material of the epitaxial layer 304. In addition, thickness of the epitaxial layer 304 may also be dependent on the corresponding color filter thereof, e.g., the thickness of the epitaxial layer 304 for providing red light may be different from that of for providing green light. The thickness of the removed epitaxial layer 304a may be in a range of about 30 nm to about 50 nm, and the thickness of the electrodes 312 may be in a range of about 100 nm to 200 nm, and the thickness of the electrode 314 may be in a range of about 100 nm to 200 nm.

Figure 2G:
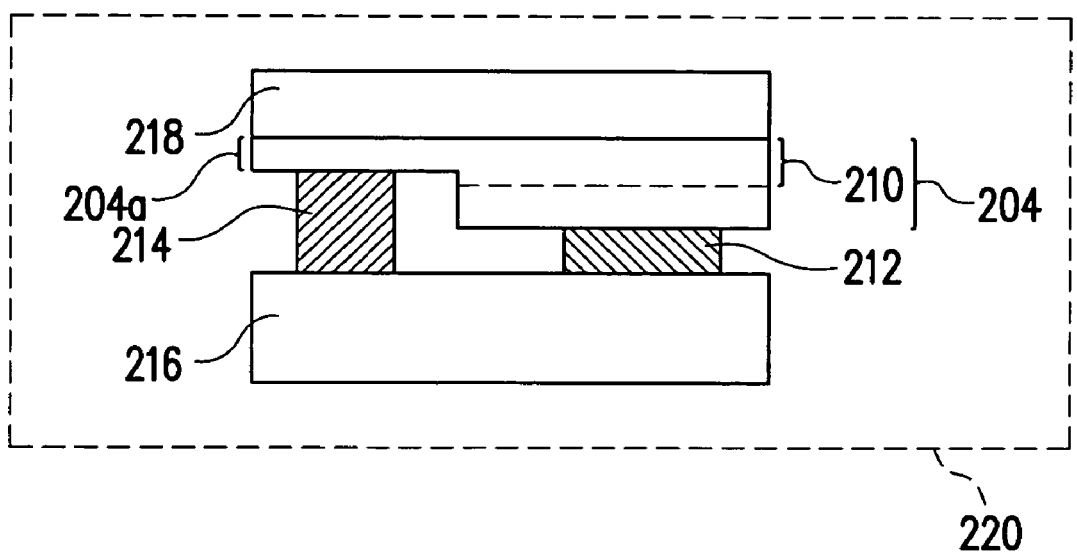
Figure 3E:
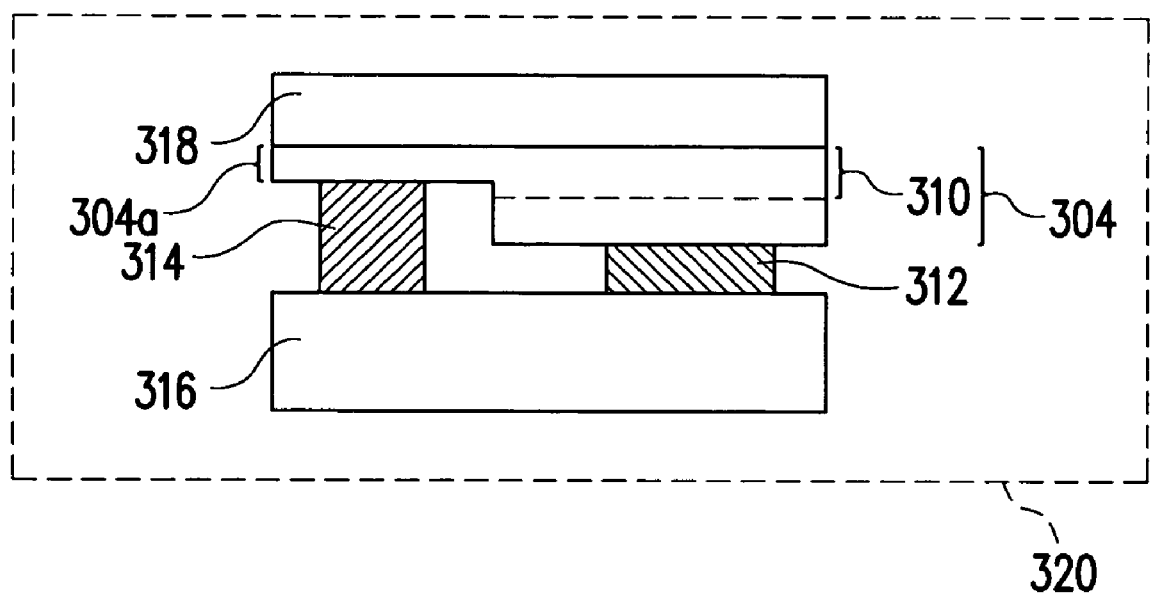

Hereinafter, a LED device of the invention with respect to FIG. 2G or FIG. 3E will be described. Referring to FIG. 2G/FIG. 3E, the LED device 220/320 comprises, for example but not limited to, the substrate 216/316, the epitaxial layer 204/304, the electrodes 212/312 and 214/314, and the protection layer 218/318. It is noted that the substrate 216/316 comprises, for example but not limited to, high heat-sink substrate, and the protection layer 218/318 comprises, for example but not limited to, high heat-sink, high transparent substrate. The configurations and properties of the elements of the LED device 220/320 are described in the foregoing embodiments of the invention and will not be described hereinafter.

Accordingly, in the LED device of the present invention, since the substrate of the conventional LED is replaced by the high heat-sink substrate disposed in the other side of the epitaxial layer, the heat-sink efficiency is enhanced and the structure strength of the LED device is maintained. In addition, since the high heat-sink, high transparent protection layer is provided, the light transmittance of the surface of the LED device is excellent, and thus the light emitting efficiency of the LED device is also excellent. Moreover, the surface of the LED device of the invention does not need to be polished. Accordingly, the present invention provides a high light emitting efficiency, high heat-sink efficiency, low-cost, simple process, and high yield LED device and manufacturing method thereof.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method for a light emitting diode (LED), comprising:
   providing a first substrate;
   forming an epitaxial layer on the first substrate;
   forming a junction substrate over the epitaxial layer by adhering an adhering layer between the epitaxial layer and the junction substrate;
   removing the first substrate;
   forming a first electrode on the epitaxial layer;
   removing a portion of the epitaxial layer to form a removed epitaxial layer;
   forming a second electrode on the removed epitaxial layer;
   forming a second substrate over the first electrode and the second substrate;
   removing the junction substrate and the adhering layer; and
   forming a protection layer over the epitaxial layer.

2. The manufacturing method of claim 1, wherein the first substrate comprises gallium arsenide (GaAs), aluminum oxide ($Al_2O_3$) or silicon carbide (SiC) substrate.

3. The manufacturing method of claim 1, wherein a material of the epitaxial layer comprises two-element compound semiconductor.

4. The manufacturing method of claim 3, wherein the two-element compound semiconductor comprises GaN, GaAs, or InN.

5. The manufacturing method of claim 1, wherein a material of the epitaxial layer comprises three-element compound semiconductor.

6. The manufacturing method of claim 5, wherein the three-element compound semiconductor comprises GaAlAs.

7. The manufacturing method of claim 1, wherein a material of the epitaxial layer comprises four-element compound semiconductor.

8. The manufacturing method of claim 7, wherein the four-element compound semiconductor comprises AlInGaP.

9. The manufacturing method of claim 1, wherein the junction substrate comprises glass, silicon substrate or aluminum oxide ($Al_2O_3$) substrate.

10. The manufacturing method of claim 1, wherein the first substrate is removed by a dry etching process or a wet etching process.

11. The manufacturing method of claim 1, wherein a remained thickness of the removed epitaxial layer is less than a thickness of a current distribution layer of the epitaxial layer, and the second electrode is connected to the current distribution layer of the epitaxial layer.

12. The manufacturing method of claim 1, wherein the current distribution layer is P-type, the first electrode comprises N-type ohmic contact electrode, and the second electrode comprises P-type ohmic contact electrode.

13. The manufacturing method of claim 1, wherein the current distribution layer is N-type, the first electrode comprises P-type ohmic contact electrode, and the second electrode comprises N-type ohmic contact electrode.

14. The manufacturing method of claim 1, wherein a total thickness of the first electrodes and the epitaxial layer is equal to a total thickness of the second electrode and the removed epitaxial layer.

15. The manufacturing method of claim 1, wherein the second substrate comprises high heat-sink substrate.

16. The manufacturing method of claim 15, wherein a material of the high heat-sink silicon substrate comprises ceramic.

17. The manufacturing method of claim 1, wherein the protection layer comprises high heat-sink, high transparent substrate.

18. The manufacturing method of claim 17, wherein a material of the high heat-sink, high transparent substrate comprises diamond-like carbon (DLC), silicon oxide ($SiO_2$) or silicon nitride ($SiN_x$).

* * * * *